United States Patent
Niimi et al.

(10) Patent No.: US 6,625,516 B2
(45) Date of Patent: Sep. 23, 2003

(54) ELECTRIC LOAD DRIVING DEVICE AND METHOD OF USING THE SAME

(75) Inventors: Yukihide Niimi, Chita-gun (JP); Toru Itabashi, Anjo (JP)

(73) Assignee: Denso Corporation, Kariya (JP)

( * ) Notice: Subject to any disclaimer, the term of this patent is extended or adjusted under 35 U.S.C. 154(b) by 177 days.

(21) Appl. No.: 09/799,623

(22) Filed: Mar. 7, 2001

(65) Prior Publication Data

US 2001/0047220 A1 Nov. 29, 2001

(30) Foreign Application Priority Data

Apr. 20, 2000 (JP) ........................................ 2000-119468

(51) Int. Cl.[7] .............................................. G06F 19/00
(52) U.S. Cl. .......................... 700/170; 700/40; 327/108
(58) Field of Search .................... 700/170, 40; 327/110, 327/108; 318/801

(56) References Cited

U.S. PATENT DOCUMENTS

| | | | | |
|---|---|---|---|---|
| 3,720,819 A | * | 3/1973 | Newton et al. | ................ 714/49 |
| 4,133,027 A | * | 1/1979 | Hogan | ........................ 700/82 |
| 4,972,130 A | | 11/1990 | Rossi et al. | |
| 5,754,879 A | | 5/1998 | Johnston | |
| 5,757,213 A | | 5/1998 | Moller | |
| 5,828,247 A | | 10/1998 | Moller et al. | |
| 6,104,977 A | * | 8/2000 | Avery, Jr. | .................... 701/101 |
| 6,333,617 B1 | * | 12/2001 | Itabashi et al. | ............. 318/801 |

* cited by examiner

*Primary Examiner*—Leo Picard
*Assistant Examiner*—Carlos R. Ortiz
(74) *Attorney, Agent, or Firm*—Nixon & Vanderhye P.C.

(57) ABSTRACT

In an electric load driving device, in the case of a high-side output mode, an output FET is supplied, when connected with a higher-potential side than a load, at its gate with a boosted voltage higher than a battery voltage in response to one control signal as selected from two control signals by a switch signal. In the case of a low-side output mode, the FET is supplied, when connected with a lower-potential side than the load, at its gate with the battery voltage in response to the selected signal. These cases are switched in response to a signal indicating the bit value of the output mode setting data which are stored in advance in a nonvolatile memory.

20 Claims, 3 Drawing Sheets

ELECTRIC LOAD DRIVING DEVICE AND METHOD OF USING THE SAME

CROSS REFERENCE TO RELATED APPLICATION

This application is based on and incorporates herein by reference Japanese Patent Application No. 2000-119468 filed Apr. 20, 2000.

BACKGROUND OF THE INVENTION

1. Field of the Invention

The present invention relates to an electric load driving device for supplying a drive current to an electric load in response to a control signal supplied from a microcomputer and, more particularly, to an electric load driving device for switching output mode of the drive current to the electric load between a high-side output mode and a low-side output mode.

2. Related Art

A vehicular electronic control unit, for instance an engine control unit or a transmission control unit mounted on a vehicle, controls an object by driving a variety of electric loads such as relays or solenoids in accordance with the running state of the vehicle. However, the drive mode for supplying drive currents to the electric loads is different according to the kinds or applications of the electric loads and adopts either a high-side drive mode or a low-side drive mode.

In the case of the high-side drive mode, more specifically, the electric load is connected at its one end with the low potential side (i.e., the ground potential or the potential of the negative terminal of a storage battery generally in the vehicle) of a load power source and at its other end with the electronic control unit, so that the drive current flows out to the electric load from the side of the electronic control unit. In the case of the low-side drive mode, on the other hand, the electric load is connected at its one end with the high potential side (i.e., the battery voltage or the potential of the positive terminal of the battery generally in the vehicle) of a load power source and at its other end with the electronic control unit, so that the drive current flows in from the electric load to the side of the electronic control unit.

In U.S. Pat. No. 5,828,247, for example, there is proposed an electric load driving integrated circuit (IC) which is enabled by a program to switch the output mode of a drive current to the electric load between a high-side output mode and a low-side output mode. This electric load driving device is provided with one N-channel MOSFET as an output transistor for supplying the drive current to the electric load.

Here, the above electric load driving device is provided with a volatile register for storing output mode setting data indicating the output mode to be adopted by the IC. Each time of the power-on for starting the feed of the operating power, the output mode setting data are inputted from the outside and stored in the register so that the output mode may be set to either the high-side output mode or the low-side output mode in accordance with the data stored in the register.

Where the above electric load driving device is mounted together with a microcomputer on an electronic control unit thereby to control the energization of the electric load in accordance with a control signal applied from the microcomputer, therefore, the microcomputer outputs the output mode setting data to the electric load driving device at each power-on thereby to fix the output mode of the electric load driving device.

In this case, however, no problem arises for the time period while the microcomputer normally operates. Where the electric load to be energized is one to be used for controlling the engine, such as the igniter for igniting air-fuel mixture in the engine, however, there arises the following problem.

First of all, generally, the electric load to be used for controlling the engine of the vehicle has to be subjected to a backup control. In this control, the electric load is energized according to a backup control signal outputted from a backup control circuit different from the microcomputer, where the microcomputer does not normally operate, that is, when a stable operating voltage may not be supplied to the microcomputer at the engine starting time as the battery voltage falls or when the microcomputer erroneously executes programs.

In this electric load driving device, the output mode cannot be set to a proper one of the high-side output mode and the low-side output mode, unless the microcomputer operates normally, so that the backup control cannot be made.

SUMMARY OF THE INVENTION

The present invention therefore has an object to provide an electric load driving device capable of reliably executing a backup control of an electric load, even when an external circuit such as a microcomputer does not normally operate although the output mode of a drive current to the electric load can be arbitrarily set to either a high-side or low side output mode.

In a specific description, the electric load driving device may be employed in the following manners (1) to (3).

(1) A control signal switching logic circuit is provided outside the IC.

Specifically, this logic circuit receives from the outside: two control signals A and B of a first one A and a second one B instructing the energization and deenergization of an electric load; and a switch signal C indicating which one of the two control signals A and B is to be actually employed for the energization control of the electric load, and supplies the first control signal A as a practically employed control signal to input means of the IC, where the switch signal C is at the logic level indicating the employment of the first control signal A, and the second control signal B as a practically employed control signal to the input means of the IC, where the switch signal C is at the logic level indicating the employment of the second control signal B.

(2) Moreover, the electronic control unit, on which the IC is mounted, is provided with a backup control circuit.

Specifically, this backup control circuit checks whether or not the microcomputer normally operates, and outputs the switch signal at the logic level indicating the employment of the first control signal A, where it is determined that the microcomputer normally operates, the switch signal C at the logic level indicating the employment of the second control signal B, where it is determined that the microcomputer does not normally operate, and a backup control signal instructing the energization and deenergization of the electric load in place of the microcomputer.

(3) The control signal outputted from the microcomputer is inputted as the first control signal A to the logic circuit of (1); the backup control signal outputted from the backup control circuit of (2) is inputted as the second control signal B to the logic circuit of (1); and the switch signal C outputted from the backup control circuit of (2) is inputted to the logic circuit of (1).

Thus, where the microcomputer normally operates, its control signal is supplied to the input means of the IC so that the electric load is supplied with the drive current by the IC in accordance with the control signal supplied from the microcomputer. Where the microcomputer does not normally operate, on the other hand, the backup control signal outputted from the backup control circuit of (2) is supplied to the input means of the IC so that the electric load is supplied with the drive current by the IC in accordance with the backup control signal supplied from the backup control circuit. Therefore, it is possible to execute the energization control of the electric load by the microcomputer and the backup control of the electric load of the case in which the microcomputer does not operate normally.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
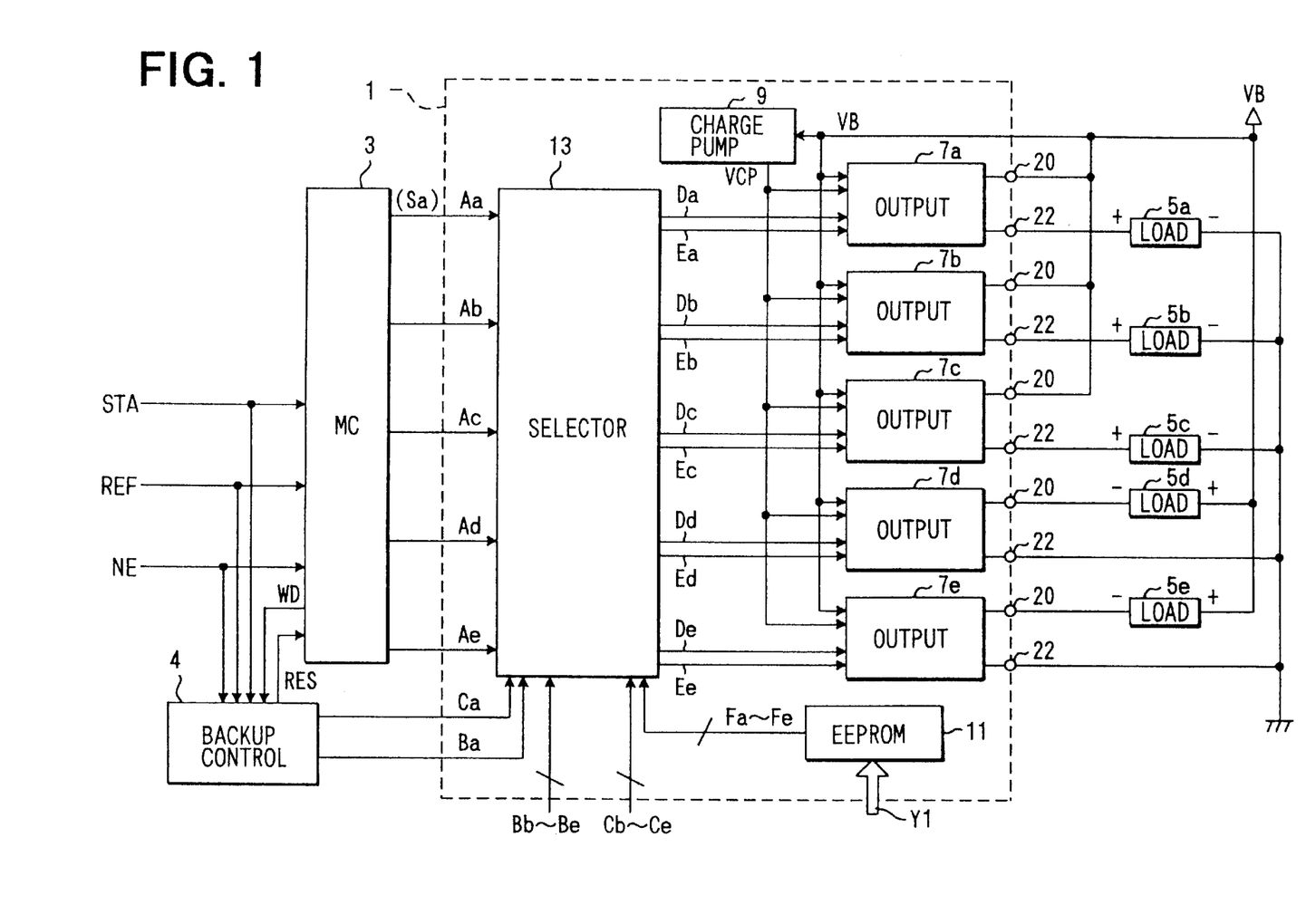
FIG. 1 is a block diagram showing an electric load driving device according to an embodiment of the present invention.

Referring first to FIG. 1, an electric load driving integrated circuit (IC) 1 is mounted as a load driving device, together with a microcomputer 3 and a backup control circuit 4 for checking whether or not the microcomputer 3 is normally operating, on a vehicular electronic control unit for controlling an engine or transmission of a vehicle, for example. In accordance with signals individually outputted from the microcomputer 3 and the backup control circuit 4, the driving device 1 supplies the drive current to individual electric load 5a to 5e such as relays or solenoids. The driving device 1 is provided with five output circuits 7a to 7e all having the same construction capable of supplying the drive current to the individual load 5a to 5e in the two output modes of a high-side output mode and a low-side output mode.

It is assumed that the loads to be driven by this driving device 1 are five in number. In the descriptions of FIG. 1 and the later, on the other hand, the suffixes "a" to "e" attached to the reference numerals of the loads and the various signals indicate what of the output circuits 7a to 7e they correspond to. In the following description, moreover, the loads and the various signals are cleared of the suffixes "a" to "e", where they are not discriminated for the output circuits 7a to 7e.

The electric load driving device 1 is provided with: a charge pump circuit 9 for boosting a battery voltage (i.e., a voltage corresponding to the higher-potential side of a load power source and specified by the voltage at the positive terminal of the battery) VB to an about twice voltage and for supplying the boosted voltage VCP to the individual output circuit 7a to 7e; a nonvolatile EEPROM 11 (nonvolatile memory) for storing the output mode setting data indicating the output mode to be taken by the individual output circuit 7a to 7e; and a selector circuit 13 for activating the individual output circuit 7a to 7e in the output modes which are indicated by the output mode setting data in the EEPROM 11.

The output mode setting data to be stored in the EEPROM 11 are 5-bit data which are composed of individual bit corresponding individually to the output circuits 7a to 7e. The bit value "1" indicates a high-side output mode, whereas the bit value "0" indicates a low-side output mode.

The output mode setting data are stored in advance in the EEPROM 11, as indicated by arrow Y1, before the driving device 1 is mounted in the electronic control unit. With the driving device 1 being mounted in the electronic control unit so that it is supplied with the operating voltage (e.g., 5 V) moreover, the signals of the individual bit of the output mode setting data, as stored in the EEPROM 11, are supplied, as output mode setting signals Fa to Fe corresponding to the individual output circuit 7a to 7e, to the selector circuit 13.

On the basis of first control signals Aa to Ae, second control signals Ba to Be and switch signals Ca to Ce, on the other hand, the selector circuit 13 outputs to the individual output circuit 7a to 7e first drive command signals Da to De for the high-side output mode and second drive command signals Ea to Ee for the low-side output mode.

The first control signals Aa to Ae and the second control signals Ba to Be are signals for instructing the energization and deenergization of the loads 5, and the switch signals Ca to Ce are signals for indicating which of a first control signal A and a second control signal B is to be actually used for the energization control of the loads 5. Moreover, the individual control signal A or B is high-active so that it turns on the loads 5 when at the high level. On the other hand, the switch signals C take such logic levels that the high level indicates the use of the first control signals A, whereas the low level indicates the use of the second control signals B.

Figure 2:
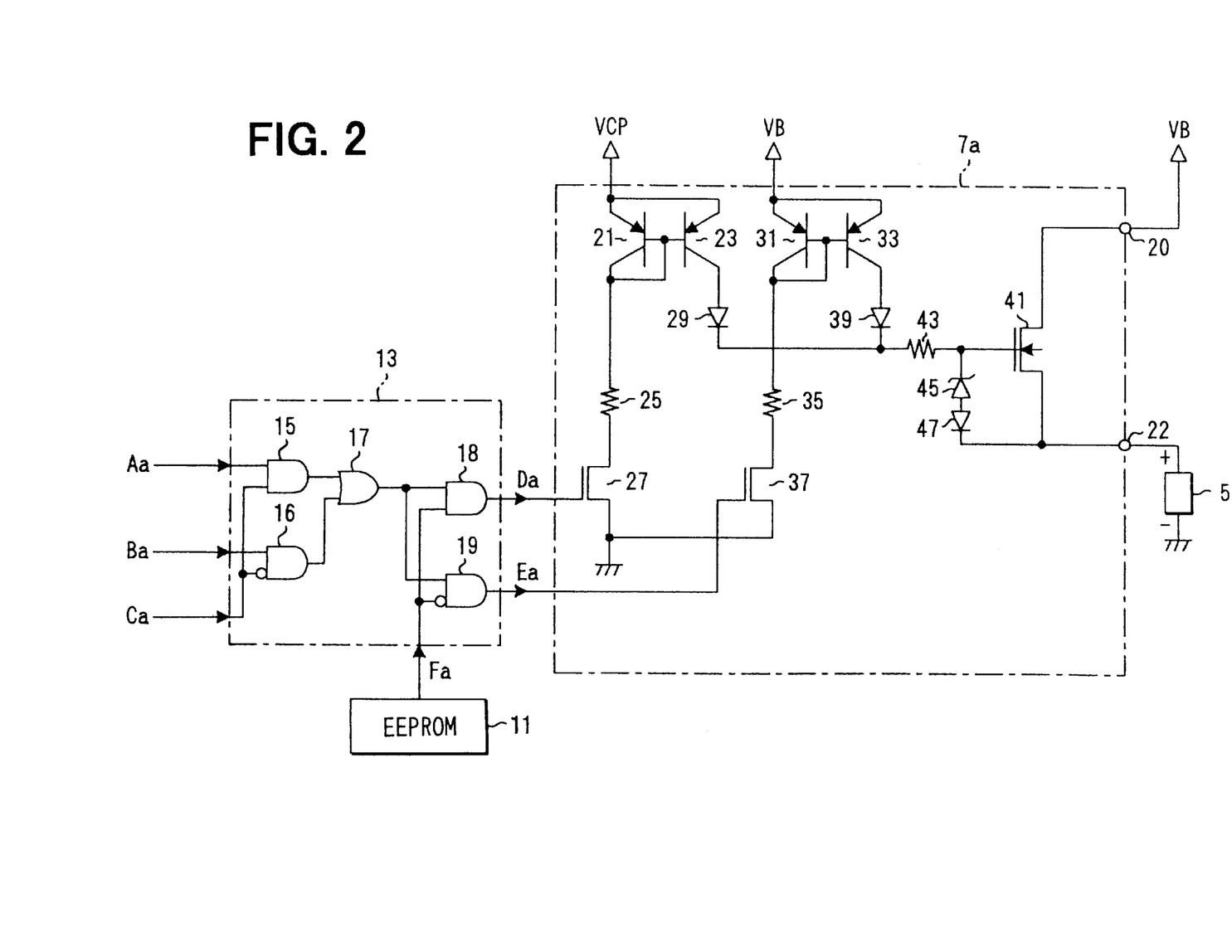
FIG. 2 is a circuit diagram showing a selector circuit and an output circuit in the electric load driving device under a condition that the output circuit is activated in a high-side output mode.
Figure 3:
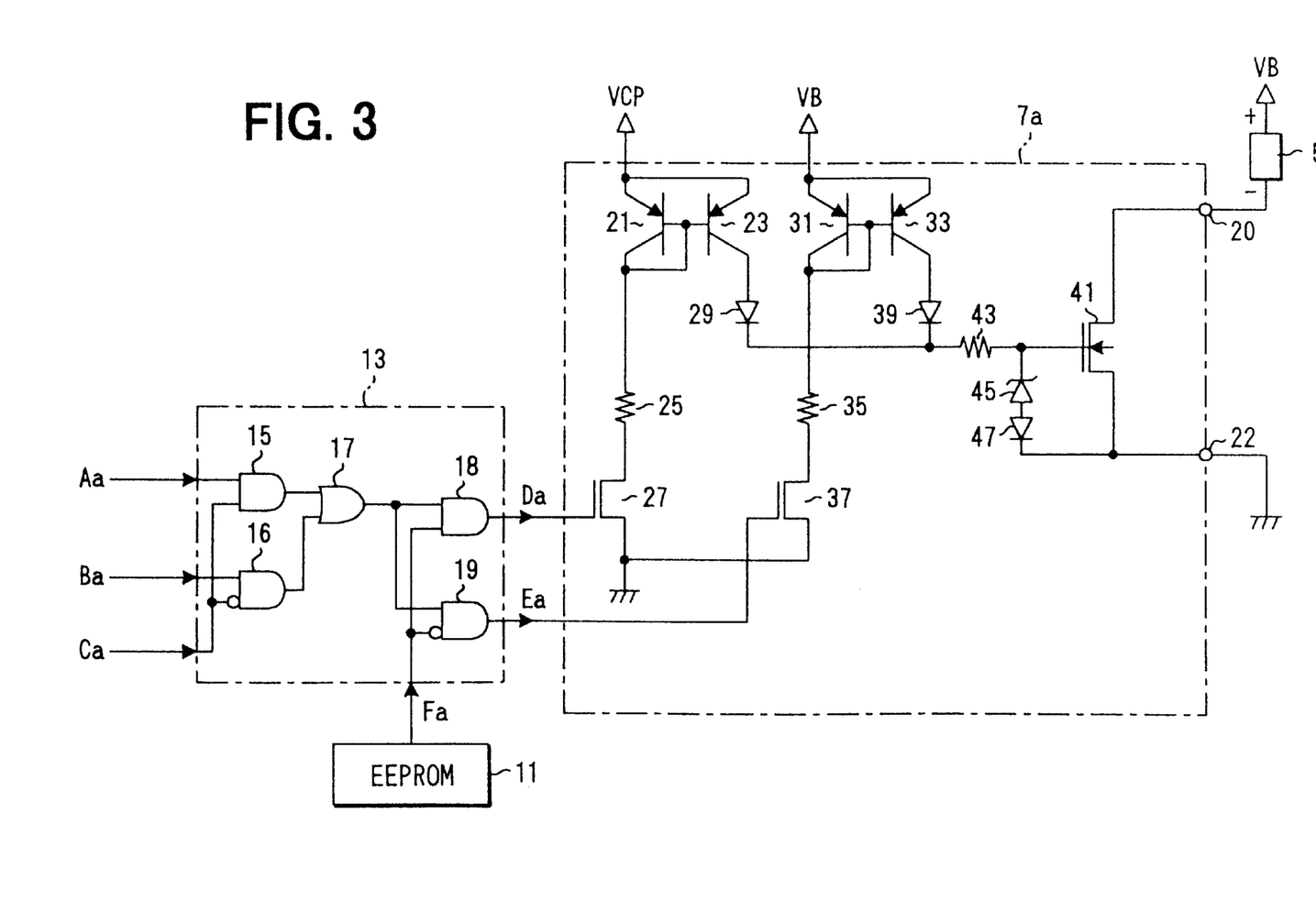
FIG. 3 is a circuit diagram showing the selector circuit and the output circuit in the electric load driving device under a condition that the output circuit is activated in a low-side output mode.

The selector circuit 13 will be described more specifically with respect to a case for outputting the first drive command signal Da and the second drive command signal Ea to the output circuit 7a. As shown in FIGS. 2 and 3, the selector circuit 13 is provided with AND gates 15, 16, 18, 19 and an OR gate 17.

The AND gate 15 is receives the first control signal Aa and the switch signal Ca, as supplied from the outside of the driving device 1, and outputs an AND signal of the two signals Aa and Ca. The AND gate 16 inputs the second control signal Ba and the switch signal Ca, as supplied from the outside of the driving device 1, and outputs an AND signal of the signal, as logically inverted from the switch signal Ca, and the second control signal Ba. The OR gate 17 outputs an OR signal of the output signal of the AND gate 15 and the output signal of the AND gate 16. The AND gate 18 inputs the output signal of the OR gate 17 and the output mode setting signal Fa from the EEPROM 11, and outputs an AND signal of the two signals, as the first drive command signal DA to the output circuit 7a. The AND gate 19 inputs the output signal of the OR gate 17 and the output mode setting signal Fa from the EEPROM 11, and outputs an AND signal of the signal, as logically inverted from the output mode setting signal Fa, and the output signal of the OR gate 17, as the second drive command signal Ea to the output circuit 7a.

The first drive command signal Da and the second drive command signal Ea, as outputted from the selector circuit 13 to the output circuit 7a, are enumerated in the following Table. In the Table, letter "L" indicates the low level, and letter "H" indicates the high level.

TABLE

|     | Fa | Ca | Da | Ea |
|-----|----|----|----|----|
| <1> | H  | H  | Aa | L  |
|     |    | L  | Ba | L  |
| <2> | L  | H  | L  | Aa |
|     |    | L  | L  | Ba |

Specifically, in the case <1> in which the output mode setting signal Fa from the EEPROM 11 is at the high level ("1") indicating the high-side output mode, the second drive command signal Ea outputted from the AND gate 19 to the output circuit 7a is set to the low level. But the first drive command signal Da outputted from the AND gate 18 to the output circuit 7a takes the same logic level as that of the signal supplied from the OR gate 17 to the AND gates 18 and 19. Therefore, the first drive command signal Da to the output circuit 7a takes the same logic level as that of the first control signal Aa, where the switch signal Ca is at the high level, and takes the same logic level as that of the second control signal Ba where the switch signal Ca is at the low level. This is because the first control signal Aa from the outside is supplied from the OR gate 17 to the AND gates 18 and 19 if the switch signal Ca is at the high level whereas, the second control signal Ba from the outside is supplied from the OR gate 17 to the AND gates 18 and 19 if the switch signal Ca is at the low level.

On the other hand, in the case <2> in which the output mode setting signal Fa from the EEPROM 11 is at the low level ("0") indicating the low-side output mode, the first drive command signal Da outputted from the AND gate 18 to the output circuit 7a is set to the low level. The second drive command signal Ea outputted from the AND gate 19 to the output circuit 7a takes the same logic level as that of the signal supplied from the OR gate 17 to the AND gates 18 and 19. Therefore, the second drive command signal Ea to the output circuit 7a takes the same logic level as that of the first control signal Aa, where the switch signal Ca is at the high level, and takes the same logic level as that of the second control signal Ba where the switch signal Ca is at the low level.

For the remaining output circuits 7b to 7e, although not shown, the selector circuit 13 is constructed in the same manner, each of which is composed of the AND gates 15, 16, 18, 19 and the OR gate 17 as described above. Moreover, the selector circuit 13 outputs the first drive command signals Db to De and the second drive command signals Eb to Ee, in the same manners as those of the cases <1> and <2> of Table, to the individual output circuit 7b to 7e other than the output circuit 7a.

As shown in FIG. 1, on the other hand, the electric load driving device 1 is provided with a set of a high potential side output terminal 20 and a low potential side output terminal 22 for each of the output circuits 7a to 7e.

Where the load 5a is to be driven on the high side by the output circuit 7a, for example, the negative (−) side terminal of the load 5a is connected with the ground potential (i.e., the potential corresponding to the low potential side of the load power source, that is, the potential of the negative terminal of the battery), as exemplified in FIG. 1. The positive (+) side terminal of the load 5a is connected with the low potential side output terminal 22 corresponding to the output circuit 7a, and the high potential side output terminal 20 corresponding to the output circuit 7a is connected with the battery voltage VB. In this case, the drive current flows from the low potential side output terminal 22 corresponding to the output circuit 7a to the load 5a.

Where the load 5e is to be driven on the low side by the output circuit 7e, on the other hand, the positive side terminal of the load 5e is connected with the battery voltage VB, whereas the negative side terminal of the load 5e is connected with the high potential side output terminal 20 corresponding to the output circuit 7e. The low potential side output terminal 22 corresponding to the output circuit 7e is connected with the ground potential. In this case, the drive current flows from the load 5e to the high potential side output terminal 20 corresponding to the output circuit 7e.

Here, the external connection states of this electric load driving device 1 in FIG. 1 exemplify the case in which the three loads 5a to 5c are individually driven on the high side by the output circuits 7a to 7c, and the remaining two loads 5d and 5e are individually driven on the low side by the output circuits 7d and 7e.

As shown in FIGS. 2 and 3, the output circuit 7a is provided with a PNP transistor 21, a PNP transistor 23, a resistor 25 a N-channel MOSFET 27 and a diode 29. The PNP transistor 21 has an emitter supplied with the boosted voltage VCP, as outputted from the charge pump circuit 9. Its base and collector are connected to each other. The PNP transistor 23 has an emitter and a base connected with the emitter and base of the PNP transistor 21, respectively, to form a current mirror circuit together with the PNP transistor 21. The resistor 25 is connected at its end with the collector of the PNP transistor 21. The N-channel MOSFET 27 has a drain connected with the other end of the resistor 25, a source connected with the ground potential and a gate supplied with the first drive command signal Da from the selector circuit 13. The diode 29 has an anode connected with the collector of the PNP transistor 23.

The output circuit 7a is further provided with a PNP transistor 31, a PNP transistor 33, a resistor 35, a N-channel MOSFET 37 and a diode 39. The PNP transistor 31 has an emitter supplied with the battery voltage VB. Its base and collector are connected to each other. The PNP transistor 33 has an emitter and a base connected with the emitter and the base of the PNP transistor 31, respectively, to form a current mirror circuit together with the PNP transistor 31. The resistor 35 is connected at its one end with the collector of the PNP transistor 31. The N-channel MOSFET 37 has a drain connected with the other end of the resistor 35, a source connected with the ground potential and a gate supplied with the second drive command signal Ea from the selector circuit 13. The diode 39 has an anode connected with the collector of the PNP transistor 33 and a cathode connected commonly with the cathode of the diode 29.

The output circuit 7a is still further provided with an N-channel MOSFET 41, a gate protecting resistor 43, a Zener diode 45 and a diode 47. The N-channel power MOSFET 41 has a drain connected with the high potential side output terminal 20, as corresponding to the output circuit 7a, and a source connected with the low potential side output terminal 22, as corresponding to the output circuit 7a, to operate as an output transistor. The gate protecting resistor 43 is connected between the cathodes of the two diodes 29 and 39 and the gate of the FET 41. The Zener diode 45 has a cathode connected with the gate of the FET 41. The diode 47 has an anode connected with the anode of the Zener diode 45 and a cathode connected with the source of the FET 41. The Zener diode 45 is provided for preventing an overvoltage from being applied to the gate of the FET 41. The diode 47 is provided for preventing the gate-source of the FET 41 from being reverse-biased.

In the output circuit 7a thus constructed, where the load 5 is driven on the high side (that is, where the same used in the high-side output mode), the drain of the FET 41 is connected through the high potential side output terminal 20 with the battery voltage VB, as shown in FIG. 2, and the source of the FET 41 is connected through the low potential side output terminal 22 with the positive side terminal of the load which is connected at its negative side terminal with the ground potential. That is, the two output terminals 20 and 22, as corresponding to the output circuit 7a, are connected in series with a higher-potential side than the load 5 in the current supply path to the load 5. Thus, the FET 41 functions in that connection state as high-side drive means.

In this case, of the output mode setting data stored in advance in the EEPROM 11, the bit corresponding to the output circuit 7a is the value "1" indicating the high-side output mode. Accordingly, the output mode setting signal Fa of the output circuit 7a, as supplied from the EEPROM 11 to the selector circuit 13, takes the high level.

Then, the second drive command signal Ea outputted from the selector circuit 13 to the output circuit 7a is at the low level. However, the first drive command signal Da outputted from the selector circuit 13 to the output circuit 7a takes the same logic level as that of the first control signal Aa, if the switch signal Ca supplied from the outside is at the high level, and takes the same logic level as that of the second control signal Ba if the switch signal Ca is at the low level.

In the output circuit 7a, therefore, the FET 37 is turned off, but the FET 27 responds to the first control signal Aa or the second control signal Ba, as supplied from the outside of the driving device 1, so that it is turned on when that control signal is at the high level. When the FET 27 is turned on, moreover, the two transistors 21 and 23 forming the current mirror circuit are turned on, and the boosted voltage VCP from the charge pump circuit 9 is supplied from the collector of the transistor 23 to the gate of the FET 41 through the diode 29 and the resistor 43, so that the FET 41 is turned on.

If the switch signal Ca supplied from the outside is at the high level, more specifically, when the first control signal Aa also supplied from the outside takes the high level, the gate of the FET 41 connected on the high side with the load 5 (that is, connected on the higher-potential side than the load 5) is supplied with the boosted voltage VCP about twice as high as the battery voltage VB, so that the FET 41 is turned on. When the FET 41 is turned on, moreover, the drive current flows out to the load 5 through the low potential side output terminal 22. If the switch signal Ca supplied from the outside is at the low level, on the other hand, when the second control signal Ba also supplied from the outside takes the high level, the gate of the FET 41 is supplied with the boosted voltage VCP so that the FET 41 is turned on. Then, the drive current flows out from the source of the FET 41 to the load 5 through the low potential side output terminal 22.

In the output circuit 7a, on the other hand, where the load 5 is driven on the low side (that is, where the same used in the low-side output mode), the drain of the FET 41 is connected through the high potential side output terminal 20 with the negative side terminal of the load 5 connected at its positive side terminal with the battery voltage VB, as shown in FIG. 3. The source of the FET 41 is connected through the low potential side output terminal 22 with the ground potential. That is, the two output terminals 20 and 22, as corresponding to the output circuit 7a, are connected in series with a lower-potential side than the load 5 in the current supply path to the load 5. The FET 41 functions in that connection state as low-side drive means.

First of all, in this case, of the output mode setting data stored in advance in the EEPROM 11, the bit corresponding to the output circuit 7a is the value "0" indicating the low-side output mode. Accordingly, the output mode setting signal Fa of the output circuit 7a, as supplied from the EEPROM 11 to the selector circuit 13, takes the low level.

Then, the first drive command signal Da outputted from the selector circuit 13 to the output circuit 7a is set to the low level, but the second drive command signal Ea outputted from the selector circuit 13 to the output circuit 7a takes the same logic level as that of the first control signal Aa, if the switch signal Ca supplied from the outside is at the high level, and takes the same logic level as that of the second control signal Ba if the switch signal Ca is at the low level.

In the output circuit 7a, therefore, the FET 27 is turned off, but the FET 37 responds to the first control signal Aa or the second control signal Ba, as supplied from the outside of the driving device 1, so that it is turned on when that control signal is at the high level. When the FET 37 is turned on, moreover, the two transistors 31 and 33 forming the current mirror circuit are turned on, and the battery voltage VB is supplied from the collector of the transistor 33 to the gate of the FET 41 through the diode 39 and the resistor 43, so that the FET 41 is turned on.

If the switch signal Ca supplied from the outside is at the high level, more specifically, when the first control signal Aa also supplied from the outside takes the high level, the gate of the FET 41 connected on the low side with the load 5 (that is, connected on the lower-potential side than the load 5) is supplied with the battery voltage VB, so that the FET 41 is turned on. When the FET 41 is turned on, moreover, the drive current of the load 5 flows in to the drain of the FET 41 from the side of the load 5 through the high potential side output terminal 20. If the switch signal Ca supplied from the outside is at the low level, on the other hand, when the second control signal Ba also supplied from the outside takes the high level, the gate of the FET 41 is supplied with the battery voltage VB so that the FET 41 is turned on. Then, the drive current of the load flows in from the side of the load 5 to the drain of the FET 41 through the high potential side output terminal 20.

In a specific case in which the energization of the load needed for the backup control is performed by using the electric load driving device 1 in the following manner, when the microcomputer 3 fails to operate normally. In this case, the load to be energized is an igniter for igniting the engine.

It is assumed that the load 5a in FIG. 1 is the igniter, and that the load 5a is driven on the high side by the output circuit 7a, as shown in FIG. 1. On the other hand, it is assumed, as exemplified in FIG. 1, that the microcomputer 3 outputs a control signal Sa for instructing the energization and deenergization of the igniter, on the basis of a starter signal (STA) taking the high level when a starter motor for starting the engine operates, a reference position signal (REF) generated when the rotational position of the crankshaft of the engine comes to a predetermined reference position, and an engine speed signal (NE) generated each time the crankshaft rotates a predetermined angle.

In this case, in the EEPROM 11, the bit "1" indicating the high-side output mode is electrically stored in advance as that of the output mode setting data corresponding to the output circuit 7a.

On the other hand, the backup control circuit 4, as mounted together with the microcomputer 3 and the electric load driving device 1 on the electronic control unit, monitors whether or not the microcomputer 3 normally operates, on the basis of the period of the well-known watch dog signal (WD), as outputted from the microcomputer 3, and outputs a reset signal (RES) to the microcomputer 3 if it is determined by the monitor based on the watch dog signal that the microcomputer 3 is abnormal.

For the time period after the reset signal is outputted to the microcomputer 3 and before the watch dog signal is again normally outputted, or for a predetermined time period after the starter signal took the high level and before the microcomputer 3 is deemed to start the normal operation reliably, still moreover, the backup control circuit 4 decides that the microcomputer 3 does not operate normally, and outputs a backup control signal (i.e., backup ignition signal) instructing the energization and the deenergization of the igniter in place of the microcomputer 3, and a state signal indicating the operation state of the microcomputer 3, at the low level indicating the abnormality.

Here, it is determined at the backup control circuit 4 that the microcomputer 3 does not operate normally for the predetermined period after the starter signal took the high level. This is because just after the operation of the starter motor, the engine is started so that the stable operating voltage cannot be supplied to the microcomputer 3 by the battery voltage having fallen. On the other hand, the backup control circuit 4 outputs the backup control signal like the microcomputer 3 on the basis of the reference position signal and the engine speed signal. Where it is determined that the microcomputer 3 normally operates, still moreover, the backup control circuit 4 fixes the backup control signal at the low level, for example, and outputs the state signal at the high level indicating that the microcomputer 3 is normal.

In this case, as exemplified in FIG. 1, the control signal Sa, as outputted from the microcomputer 3, is inputted as the first control signal Aa corresponding to the output circuit 7a, to the selector circuit 13 of the driving device 1. The backup control signal, as outputted from the backup control circuit 4, is inputted as the second control signal Ba corresponding to the output circuit 7a, to the selector circuit 13 of the driving device 1. The state signal of the microcomputer 3, as outputted from the backup control circuit 4, is inputted as the switch signal Ca corresponding to the output circuit 7a, to the selector circuit 13 of the driving device 1.

Thus, where it is determined that the backup control circuit 4 that the microcomputer 3 normally operates (that is, where the state signal outputted as the switch signal Ca from the backup control circuit 4 to the driving device 1 is at the high level), the control signal Sa from the microcomputer 3 is inputted to the AND gates 18 and 19, as corresponding to the output circuit 7a, in the circuit constructing the selector circuit 13 in the driving device 1. Thus, the load 5a or the igniter is supplied by the driving device 1 with the drive current according to the control signal Sa supplied from the microcomputer 3.

Where it is determined that the backup control circuit 4 determines that the microcomputer 3 does not normally operate (that is, where the state signal outputted as the switch signal Ca from the backup control circuit 4 to the driving device 1 is at the low level), the backup control signal from the backup control circuit 4 is inputted to the AND gates 18 and 19, as corresponding to the output circuit 7a, in the circuit constructing the selector circuit 13 in the driving device 1. Thus, the load 5a or the igniter is supplied by the driving device 1 with the drive current according to the backup control signal supplied from the backup control circuit 4.

For the igniter, therefore, it is possible to execute the energization control by the microcomputer 3 and the backup control where the microcomputer 3 does not operate normally.

This is because the driving device 1 of this embodiment is provided as the storage means for storing the output mode setting data with the EEPROM 11 capable holding the stored content even after the electric power supply is interrupted. This is also because the output mode setting data are stored in advance in the EEPROM 11 before the electronic control unit is caused for the first time by the driving device 1 to execute the energization of the load. This is further because at the stage of using the IC actually, the output modes of the individual output circuit 7a to 7e can be fixed in advance to the more proper one of the high-side output mode and the low-side output mode.

According to the electric load driving device 1 of this embodiment, the backup control for the loads 5 can be reliably made, where the microcomputer 3 does not operate normally, despite of the fact that the output mode of the drive currents for the loads 5 can be arbitrarily set to one of the high-side output mode and the low-side output mode.

In the electric load driving device 1 of this embodiment, on the other hand, there is packaged in the portion of the selector circuit 13 the logic circuit which is composed of the AND gates 15 and 16 and the OR gate 17 and which is operative for fetching one of the first control signal A and the second control signal B selectively in response to the switch signal C. Even without providing such logic circuit outside of the driving device 1, therefore, it is possible to execute the backup control for the loads 5 where the microcomputer 3 does not normally operate.

Here, although the input terminals for inputting the first and second control signals A and B and the switch signal C are omitted from the driving device 1 in FIG. 1, of the input terminals corresponding to the output circuits to be used for driving the loads 5 needing no backup control, it is sufficient to pull up the input terminal of the switch signal C to the high level, to pull down or pull up the input terminal of the second control signal B to the low level or to the high level, and to input the control signal from the microcomputer 3 to the input terminal of the first control signal A. Thus, the drive current is supplied to the load 5 needing no backup control, only in response to the control signal from the microcomputer 3.

In the electric load driving device 1 of this embodiment, on the other hand, of the two input terminals of the AND gates 18 and 19 in the selector circuit 13, the input terminal to be supplied with the output signal of the OR gate 17 corresponds to signal input means, and the logic circuit, as composed of the AND gates 15 and 16 and the OR gate 17, in the selector circuit 13 corresponds to control signal switching means. In this embodiment, on the other hand, the portion, as composed of the AND gates 18 and 19, the FETs 27 and 37, the resistors 25 and 35, the PNP transistors 21, 23, 31, 33 and the diodes 29 and 39, in the selector circuit 13 operates to cause the FET 41 as the output transistor to function as either high-side drive means or low-side drive means in accordance with the output mode setting data in the EEPROM 11.

The above embodiment may be modified in various ways.

For instance, the nonvolatile memory for storing the output mode setting data should not be limited to the EEPROM 11 but may be an EPROM, a flash ROM or a one-time PROM which can write the data at one time. On the other hand, the nonvolatile memory may store the output mode setting data just after it is mounted in the electronic control unit when this this unit is manufactured. The nonvolatile memory may be provided outside the driving IC.

The number of output circuits should not be limited to five, but may be one or two.

In the electric load driving device 1, only one common switch signal C may be inputted to all the output circuits 7a to 7e. In this case, specifically, the switch signal C of one line may be commonly inputted to the AND gates 15 and 16 which are provided to correspond to the individual output circuit 7a to 7e in the selector circuit 13.

The AND gates 15 and 16 and the OR gate 17 in the selector circuit 13 need not be provided for all the output circuits 7a to 7e but may be provided to correspond to only some of the output circuits 7a to 7e. Where the AND gates 15 and 16 and the OR gate 17 are not provided, the construction may be modified such that the first control signal A from the outside is inputted as it is to the input terminals of the AND gates 18 and 19.

If it is expected that all the output circuits 7a to 7e are not used all at once in the high-side output mode in the electric load driving device 1, the output ability of the boosted voltage VCP of the charge pump circuit 9 may be set to the minimum value capable of supplying the drive voltage (i.e., the gate voltage for turning on the FET 41) to the FETs 41 of the output circuits of the maximum number that is expected to be used all at once in the high-side output mode. Thus, the construction of the charge pump circuit 9 can be made the necessary minimum.

Still further modifications are also possible without departing from the spirit of the invention.

What is claimed is:

1. An electric load driving device mounted in an electronic control unit comprising:

two output terminals connected in series with an electric current supply path for supplying a drive current to the electric load;

a single switching output transistor connected in series with the two output terminals;

input means for inputting a control signal from outside; and storage means storing output mode setting data therein; wherein a mode of outputting the drive current to the electric load is set to either one of a high-side output mode or a low-side output mode in accordance with the output mode setting data stored in the storage means, the high-side output mode being for rendering the two terminals conductive in response to the control signal inputted from the input means while being connected with a higher-potential side than the electric load in the current supply path thereby to supply the drive current to the electric load via the single switching output transistor, the low-side output mode being for rendering the two terminals conductive in response to the control signal inputted from the input means while being connected with a lower-potential side than the electric load in the current supply path thereby to supply the drive current from the electric load via the single switching output transistor, and wherein the storage means is a nonvolatile memory capable of holding the output mode setting data even after being interrupted from an electric power supply, and stores the output mode setting data in advance before the energization of the electric load is executed for the first time, with the electronic control unit being arranged to control the energization of the electric load.

2. The electric load driving device as in claim 1, further comprising:

control signal switching means for receiving from outside a first control signal instructing the energization and deenergization of the electric load, a second control signal instructing the energization and deenergization of the electric load independently of the first control signal, and a switch signal indicating which one of the first and second control signals is to be employed for the energization control of the electric load, to supply the first control signal as the control signal to the input means, where the switch signal is at a logic level indicating the employment of the first control signal, and the second control signal as the control signal to the input means, where the switch signal is at a logic level indicating the employment of the second control signal.

3. A method of employing the electric load driving device as in claim 2, wherein:

the electric load driving device includes a backup control circuit for checking whether the control signal is normally outputted from the outside, to output the switch signal at the logic level indicating the employment of the first control signal where it is determined that the control signal is normally outputted, to output the switch signal at the logic level indicating the employment of the second control signal where it is determined that the control signal is not normally outputted, and to output a backup control signal instructing the energization and deenergization of the electric load in place of the control signal, wherein the control signal outputted from the outside is inputted as the first control signal to the control signal switching means, the backup control signal outputted from the backup control circuit is inputted as the second control signal to the control signal switching means, and the switch signal outputted from the backup control circuit is inputted to the control signal switching means.

4. The electric load driving device as in claim 1, wherein:

the input means is connected to a microcomputer which outputs the control signal instructing energization and deenergization of the electric load.

5. The electric load driving device as in claim 4, wherein:

the input means is connected to a backup control circuit for checking whether the microcomputer normally operates, to output a backup control signal instructing the energization and deenergization of the electric load in place of the microcomputer when it is determined that the microcomputer does not operate normally.

6. The electric load driving device as in claim 5, wherein:

the backup control circuit receives same input signal as the microcomputer and outputs the same control signal as the microcomputer.

7. The electric load driving device as in claim 4, wherein:

the output mode setting data are written in the storage means independently of the microcomputer.

8. The electric load driving device as in claim 1, wherein:

the load is connected to control a vehicle operation.

9. The electric load driving device as in claim 8, wherein:

the load is connected to control an engine operation.

10. The electric load driving device as in claim 8, wherein:

the load is connected to control a transmission operation.

11. A method of driving an electric load device mounted in an electronic control unit, the method comprising:

connecting two output terminals in series with an electric current supply path for supplying a drive current to the electric load;

connecting a single switching output transistor in series with the two output terminals;

providing an input device for inputting a control signal; and storing output mode setting data in a nonvolatile memory;

wherein a mode of outputting the drive current to the electric load is set to either one of a high-side output mode or a low-side output mode in accordance with the output mode setting data stored in the nonvolatile memory, the high-side output mode being for rendering the two terminals conductive in response to the control signal from the input device while being connected with a higher-potential side than the electric load in the current supply path thereby to supply the drive current to the electric load via the single switching output transistor, the low-side output mode being for rendering the two terminals conductive in response to the control signal from the input device while being connected with a lower-potential side than the electric load in the current supply path thereby to supply the drive current from the electric load via the single switching output transistor, and wherein the nonvolatile memory holds the output mode setting data even after being interrupted from an electric power supply, and stores the output mode setting data in advance before the energization of the electric load is executed for the first time, with the electronic control unit being arranged to control the energization of the electric load.

12. The method as in claim 11, further comprising:

receiving (i) a first control signal instructing the energization and deenergization of the electric load, (ii) a second control signal instructing the energization and deenergization of the electric load independently of the first control signal, and (iii) a switch signal indicating which one of the first and second control signals is to be employed for the energization control of the electric load in a control signal switch to supply the first control signal as the control signal to the input device, where the switch signal is at a logic level indicating the employment of the first control signal, and the second control signal as the control signal to the input device, where the switch signal is at a logic level indicating the employment of the second control signal.

13. A method as in claim 12, wherein:

the electric load driving device includes a backup control circuit for checking whether the control signal is normally outputted from the outside, to output the switch signal at the logic level indicating the employment of the first control signal where it is determined that the control signal is normally outputted, to output the switch signal at the logic level indicating the employment of the second control signal where it is determined that the control signal is not normally outputted, and to output a backup control signal instructing the energization and deenergization of the electric load in place of the control signal, wherein the control signal outputted from the outside is inputted as the first control signal to the control signal switch, the backup control signal outputted from the backup control circuit is inputted as the second control signal to the control signal switch, and the switch signal outputted from the backup control circuit is inputted to the control signal switch.

14. The method as in claim 11, further comprising connecting the input device to a microcomputer which outputs the control signal instructing energization and deenergization of the electric load.

15. The method as in claim 14, further comprising connecting the input device to a backup control circuit for checking whether the microcomputer normally operates and outputting a backup control signal instructing the energization and deenergization of the electric load in place of the microcomputer when it is determined that the microcomputer does not operate normally.

16. The method as in claim 15, wherein the backup control circuit receives the same input signal as the microcomputer and outputs the same control signal as the microcomputer.

17. The method as in claim 14, wherein the output mode setting data are written in the nonvolatile memory independently of the microcomputer.

18. The method as in claim 11, further comprising connecting the load to control a vehicle operation.

19. The method as in claim 18, further comprising connecting the load to control an engine operation.

20. The method as in claim 18, further comprising connecting the load to control a transmission operation.

* * * * *